(12) United States Patent
Kim et al.

(10) Patent No.: US 8,729,683 B2
(45) Date of Patent: May 20, 2014

(54) POWER MODULE PACKAGE AND METHOD FOR FABRICATING THE SAME

(75) Inventors: Kwang Soo Kim, Gyunggi-do (KR); Ji Hyun Park, Seoul (KR); Young Ki Lee, Gyunggi-do (KR); Seog Moon Choi, Seoul (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 131 days.

(21) Appl. No.: 13/235,176

(22) Filed: Sep. 16, 2011

(65) Prior Publication Data

US 2012/0319259 A1 Dec. 20, 2012

(30) Foreign Application Priority Data

Jun. 16, 2011 (KR) .................. 10-2011-0058468

(51) Int. Cl.
*H01L 23/495* (2006.01)

(52) U.S. Cl.
USPC ............ 257/677; 257/666; 257/723; 257/676

(58) Field of Classification Search
USPC .................. 257/666, 677, 676, 691, 723, 724
See application file for complete search history.

(56) References Cited

U.S. PATENT DOCUMENTS

| | | | | |
|---|---|---|---|---|
| 4,056,681 A | * | 11/1977 | Cook, Jr. .................. | 174/558 |
| 5,281,851 A | * | 1/1994 | Mills et al. ................. | 257/670 |
| 5,343,073 A | * | 8/1994 | Parthasarathi et al. ....... | 257/666 |
| 5,449,951 A | * | 9/1995 | Parthasarathi et al. ....... | 257/677 |
| 5,506,446 A | * | 4/1996 | Hoffman et al. ............. | 257/674 |
| 5,710,695 A | * | 1/1998 | Manteghi .................... | 361/813 |
| 6,034,422 A | * | 3/2000 | Horita et al. ................ | 257/677 |
| 6,133,623 A | * | 10/2000 | Otsuki et al. ................ | 257/666 |
| 6,184,575 B1 | * | 2/2001 | Chillara et al. .............. | 257/692 |
| 7,524,702 B2 | * | 4/2009 | Seki et al. .................... | 438/123 |
| 2010/0258925 A1 | * | 10/2010 | Jeon et al. .................... | 257/676 |
| 2013/0009290 A1 | * | 1/2013 | Lim et al. ..................... | 257/666 |
| 2013/0069210 A1 | * | 3/2013 | Lee et al. ..................... | 257/666 |

FOREIGN PATENT DOCUMENTS

| | | |
|---|---|---|
| JP | 2007-184542 A | 7/2007 |
| KR | 10-2009-0013564 A | 2/2009 |
| KR | 10-2009-0103599 A | 10/2009 |
| KR | 10-2011-0003093 | 1/2011 |
| KR | 10-2010-0126909 A | 12/2012 |

OTHER PUBLICATIONS

Office Action issued for the related KR App No. 10-2011-0058468 dated Jun. 11, 2012 and its English summary.
Office Action for related KR App. No. 10-2011-0061871 dated Jun. 1, 2012 and its English summary.

* cited by examiner

*Primary Examiner* — S. V. Clark
(74) *Attorney, Agent, or Firm* — Ladas & Parry, LLP (57) ABSTRACT

Disclosed herein are a power module package and a method for manufacturing the same. The power module package includes: first and second lead frames arranged to face each other, both or either of the first and second frames being made of aluminum; anodized layers formed on portions of the lead frame(s) made of aluminum in the first and second lead frames; and semiconductor devices mounted on first surfaces of the first and second lead frames.

9 Claims, 5 Drawing Sheets

POWER MODULE PACKAGE AND METHOD FOR FABRICATING THE SAME

CROSS REFERENCE TO RELATED APPLICATION

This application claims the benefit of Korean Patent Application No. 10-2011-0058468, filed on Jun. 16, 2011, entitled "Power Module Package and Method for Manufacturing the Same", which is hereby incorporated by reference in its entirety into this application.

BACKGROUND OF THE INVENTION

1. Technical Field

The present invention relates to a power module package and a method for fabricating the same.

2. Description of the Related Art

As energy usage increases over the world, a large interest has begun to focus on effective use of restricted energy. Accordingly, utilization of an inverter to which an intelligent power module (IPM) for efficient conversion used in the existing home or industrial products is applied is accelerating.

As the application of this power module is expanding, high integration, high capacity and miniaturization are increasingly required by the market. For this reason, the solution to heat generation problem of electronic parts becomes an important issue.

Therefore, there is required a high heat-radiation package structure for solving the problem with respect to generation of heat, in order to increase efficiency and secure high reliability in the power module.

SUMMARY OF THE INVENTION

The present invention has been made in an effort to provide a power module package capable of effectively removing the heat generated from semiconductor devices and a method for fabricating the same.

Further, the present invention has been made in an effort to provide a power module package capable of being easily fabricated and reducing the module fabrication costs.

According to a preferred embodiment of the present invention, there is provided a power module package, including: first and second lead frames arranged to face each other, both or either of the first and second frames being made of aluminum; anodized layers formed on portions of the lead frame(s) made of aluminum in the first and second lead frames; and semiconductor devices mounted on first surfaces of the first and second lead frames.

The anodized layers may be formed on the regions where the semiconductor devices are to be mounted, in the first surfaces of the first and second lead frames, and on second surfaces of the first and second lead frames.

The anodized layers may be formed on the second surfaces of the first and second lead frames.

The semiconductor devices may include a power device and a control device mounted on the first surfaces of the first lead frame and the second lead frame, respectively.

The first lead frame may be made of aluminum, and the power device may be mounted on the first surface of the first lead frame.

The power module package may further include metal layers for circuit on the regions where the semiconductor devices are to be mounted, in the first surfaces of the first and second lead frames. Here, the metal layers for circuit may be formed between the anodized layers and the semiconductor devices.

The power module package may further include wires for electric connection between the semiconductor devices and the first and second lead frames, or between the semiconductor devices.

The power module package may further include a molding covering a region between the first and second lead frames, and the semiconductor devices mounted on the first and second lead frames.

The molding may be formed to expose the second surfaces of the first and second lead frames.

The molding may be formed on the second surfaces of the first and second lead frames.

The power module package may further include metal layers for soldering formed on soldering regions of the lead frame(s) made of aluminum in the first and second lead frames.

According to another preferred embodiment of the present invention, there is provided a method for fabricating a power module package, including: preparing first and second lead frames which are arranged to face each other, both of or either of the first and second lead frames being made of aluminum; forming anodized layers on portions of the lead frame(s) made of aluminum in the first and second lead frames; and mounting semiconductor devices on first surfaces of the first and second lead frames, respectively.

In the forming of the anodized layers, the anodized layers may be formed on the regions where the semiconductor devices are to be mounted, in the first surfaces of the first and second lead frames, and on second surfaces of the first and second lead frames.

In the forming of the anodized layers, the anodized layers may be formed on the second surfaces of the first and second lead frames.

In the mounting of the semiconductor devices, the semiconductor devices may include a power device and a control device respectively mounted on the first surfaces of the first lead frame and the second lead frame.

The first lead frame may be made of aluminum, and in the mounting of the semiconductor devices, the power device may be mounted on the first surface of the first lead frame.

The method may further include forming metal layers for circuit on the regions where the semiconductor devices are to be mounted, in the anodized layers, after the forming of the anodized layers and before the mounting of the semiconductor devices.

The method may further include forming wires for electric connection between the semiconductor devices and the first and second lead frames, or between the semiconductor devices, after the mounting of the semiconductor devices.

The method may further include forming a molding covering a region between the first and second lead frames and the semiconductor devices mounted on the first and second lead frames, after the forming of the wires.

The method may further includes forming metal layers for soldering on soldering regions of the lead frame(s) made of aluminum in the first and second lead frames.

DESCRIPTION OF THE PREFERRED EMBODIMENTS

Various objects, advantages and features of the invention will become apparent from the following description of preferred embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted. Terms used in the specification, 'first', 'second', etc., can be used to describe various components, but the components are not to be construed as being limited to the terms.

Hereinafter, preferred embodiments of the present invention will be described in detail with reference to the accompanying drawings.

Power Module Package

Figure 1:
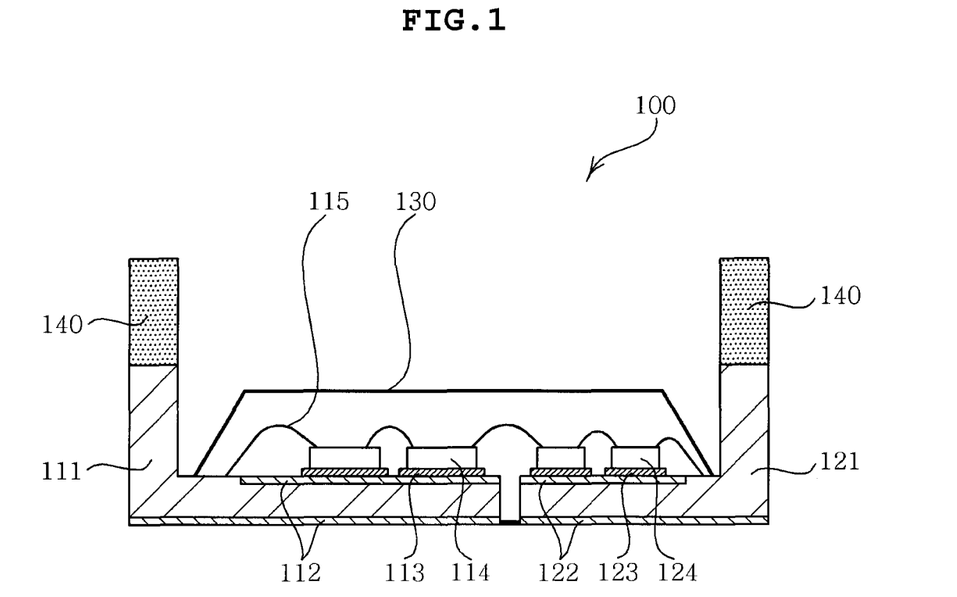
FIG. 1 shows a configuration of a power module package according to a first preferred embodiment of the present invention.

FIG. 1 shows a configuration of a power module package according to a first preferred embodiment of the present invention.

As shown in FIG. 1, a power module package 100 includes first and second lead frames 111 and 121 which are arranged to face each other and made of aluminum, anodized layers 112 and 122 respectively formed on portions of the first and second lead frames 111 and 121, and semiconductor devices 114 and 124 respectively mounted on first surfaces of the first and second lead frames 111 and 121.

In the preferred embodiments of the present invention, it will be defined that the first surfaces of the first and second lead frames mean surfaces on which semiconductor devices are to be mounted, and second surfaces of the first and second lead frames mean surfaces opposite to the surfaces on which the semiconductor devices are to be mounted.

Here, the first and second lead frames 111 and 121 are arranged such that they are spaced from and symmetrically to each other, as shown in FIG. 1.

The semiconductor devices 114 and 124 include a power device and a control device. In the first preferred embodiment, the power device and the control device are mounted on the first surfaces of the first lead frame 111 and the second lead frame 121, respectively.

As such, in the present embodiment of the present invention, the power device 114 having a high calorific value, such as an insulated gate bipolar transistor (IGBT), a diode, or the like, and the control device 124 having a small calorific value, such as a control integrated circuit (IC), are separately mounted on the first lead frame 111 and the second lead frame 121, respectively. Therefore, it is expected that the heat generated from the power device does not have an influence on the control device.

In addition, the power module package 100 further includes metal layers 113 and 123 for circuit, which are formed on the regions where the semiconductor devices 114 and 124 are to be mounted, in the first surfaces of the first and second lead frames 111 and 121. Here, as shown in FIG. 1, the metal layers 113 and 123 for circuit are formed between the anodized layers 112 and 122 and the semiconductor devices 114 and 124.

In addition, the power module package 100 may further include wires 115 formed for electric connection between the semiconductor devices 114 and 124 and the first and second lead frames 111 and 121, or between the semiconductor devices 114 and 124.

In addition, the power module package 100 may further include a molding 130 formed for covering a region between the first and second lead frames 111 and 121, and the semiconductor devices 114 and 124 mounted on the first and second frames 111 and 121.

As shown in FIG. 1, the molding 130 is formed such that the second surfaces of the first and second lead frames 111 and 121 are exposed.

According to the present preferred embodiment, the molding 130, which has a relatively lower thermal conductivity than the anodized layers 112 and 122 and the first and second lead frames 111 and 121 made of aluminum, is not formed on the second surfaces, which are lower surfaces of the first and second lead frames 111 and 121, thereby effectively transferring the heat generated from the semiconductor devices 114 and 124 (for example, radiating the heat through the second surfaces to the outside), resulting in improvement in heat radiation property.

In the first preferred embodiment of the present invention, the anodized layers are formed on the regions where the devices are to be mounted, in the first surfaces of the first and second lead frames 111 and 121, and on the second surfaces of the first and second lead frames 111 and 121.

Here, the second surfaces on which the anodized layers are formed, as shown in FIG. 1, mean bottom surfaces of the first and second lead frames 111 and 121 after forms of the first and second lead frames are formed. The anodized layers may be formed on other regions of the second surfaces without limitation thereto, depending on the needs of operators.

Here, the anodized layers may be $Al_2O_3$ layers.

In addition, the power module package 100 may further include metal layers 140 for soldering, which are formed on soldering regions of the lead frame(s) made of aluminum in the first and second lead frames 111 and 121.

Here, the metal layers 140 for soldering are configured to supplement a hardly solderable aluminum material, which may be realized by performing plating with a solderable metal material including tin (Sn).

As shown in FIG. 1, the metal layers 140 for soldering may be formed on both ends of the first and second lead frames 111 and 121, which are regions required to be soldered, after forms of the first and second lead frames 111 and 121 are formed.

As shown in FIG. 1, according to the present preferred embodiment, the anodized layers 112 and 122 are formed on only desired regions of the first and second lead frames 111 and 121 made of aluminum materials having excellent thermal conductivity, through selective anode oxidation, and the semiconductor devices 114 and 124 are mounted directly thereon. Therefore, due to the anodized layers, high insulating properties including high thermal conductivity can be expected.

Further, the lead frame itself, which are made of aluminum materials, functions as a heat radiation substrate, thereby efficiently transferring the heat from the semiconductor devices 114 and 124, resulting in improvement in heat radiation property.

Furthermore, according to the present preferred embodiment, since a separate substrate for mounting the semiconductor devices 114 and 124 thereon are omitted, the size of the power module package can be reduced and the fabrication costs can be also reduced.

Moreover, in the present preferred embodiment of the present invention, a down-set structure is not applied to the lead frame, thereby facilitating a packaging process. Here, the down-set structure means a structure in which the region of the lead frame, except a region where the semiconductor device is to be mounted, is bent to form a step height.

Figure 2:
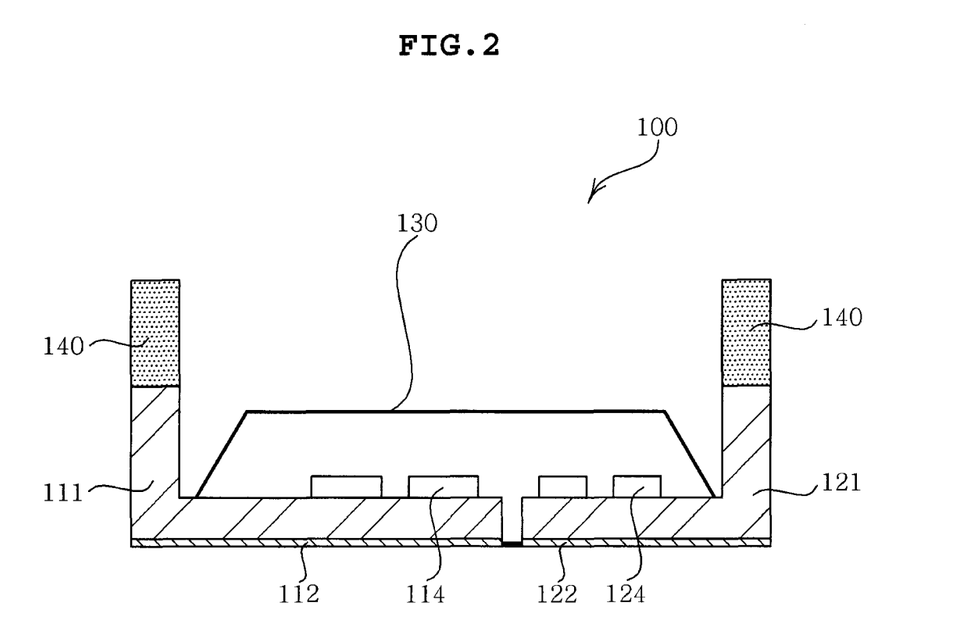
FIG. 2 shows a configuration of a power module package according to a second preferred embodiment of the present invention.

FIG. 2 shows a configuration of a power module package according to a second preferred embodiment of the present invention.

However, in the second present preferred embodiment, a description for the same components as those of the first preferred embodiments will be omitted and a description only for components different therefrom will be provided.

As shown in FIG. 2, a power module package 100 includes first and second lead frames 111 and 121 which are arranged to face each other and made of aluminum, anodized layers 112 and 122 respectively formed on portions of the first and second lead frames 111 and 121, and semiconductor devices 114 and 124 respectively mounted on first surfaces of the first and second lead frames 111 and 121.

In the preferred embodiment of the present invention, it will be defined that the first surfaces of the first and second lead frames mean surfaces on which semiconductor devices are to be mounted, and second surfaces of the first and second lead frames mean surfaces opposite to the surfaces on which the semiconductor devices are to be mounted.

In addition, the power module package 100 further includes the semiconductor devices 114 and 124, a molding 130, and metal layers 140 for soldering, and since these are the same as set forth in the first preferred embodiment, the detailed description related to these will be omitted.

Although not shown in FIG. 2, in the second preferred embodiment, wires are not formed between the semiconductor devices 114 and 124 and the first and second lead frames 111 and 121, but formed on other lead frames (not shown) disposed correspondingly to the first and second lead frames, except the first and second lead frames.

The reason of such constitution is to previously prevent a short, which may occur at the time of electric connection in a case where the same wires as the first preferred embodiment are embodied in a structure where an insulating layer is not formed on the first surfaces of the first and second lead frames 111 and 121.

Here, the wires formed between the semiconductor devices 114 and 124 may be formed in the same manner as the first preferred embodiment. The reason is that a collector and an emitter may be opened or closed by a gate in each of the semiconductor devices 114 and 124.

The above-described anodized layers 112 and 122 may be formed on the second surfaces of the first and second lead frames 111 and 121.

Here, the second surfaces on which the anodized layers are formed, as shown in FIG. 2, mean bottom surfaces of the first and second lead frames 111 and 121 after forms of the first and second lead frames are formed. The anodized layers may be formed on other regions of the second surfaces without limitation thereto, depending on the needs of operators.

In the present preferred embodiment, since the semiconductor devices 114 and 124 are mounted directly on the first and second lead frames 111 and 121 and then wire bonding is performed, instead of embodying separate circuit layers on the first and second lead frames 111 and 121, heat radiation property can be improved and the module fabrication costs can be reduced.

Figure 3:
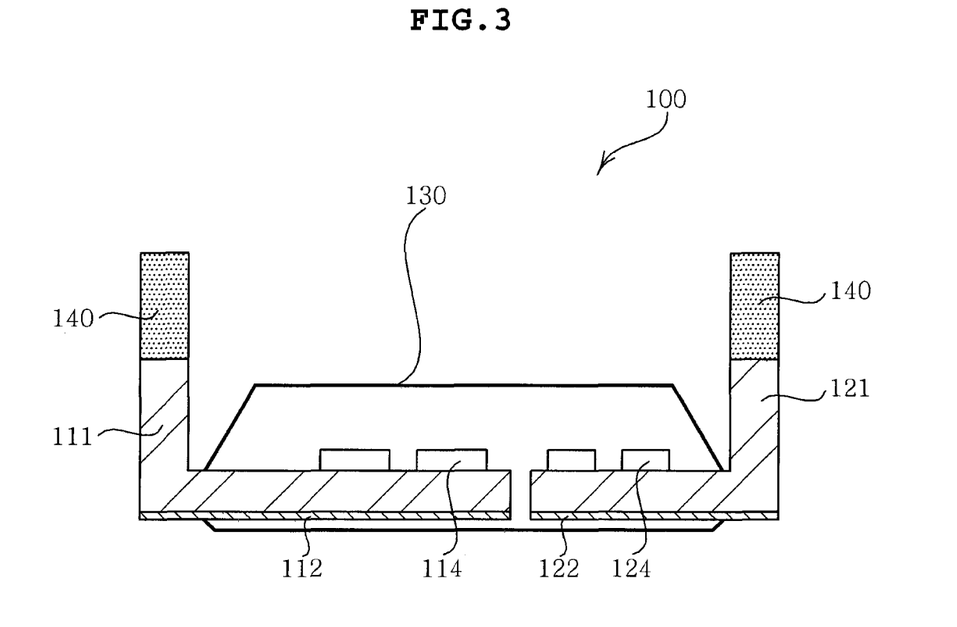
FIG. 3 shows a configuration of a power module package according to a third preferred embodiment of the present invention.

FIG. 3 shows a configuration of a power module package according to a third preferred embodiment of the present invention.

However, in the third present preferred embodiment, a description for the same components as those of the first preferred embodiments will be omitted and a description only for components different therefrom will be provided.

As shown in FIG. 3, a power module package 100 includes first and second lead frames 111 and 121 which are arranged to face each other and made of aluminum, anodized layers 112 and 122 respectively formed on portions of the first and second lead frames 111 and 121, and semiconductor devices 114 and 124 respectively mounted on first surfaces of the first and second lead frames 111 and 121.

In the preferred embodiment of the present invention, it will be defined that the first surfaces of the first and second lead frames mean surfaces on which semiconductor devices are to be mounted, and second surfaces of the first and second lead frames mean surfaces opposite to the surfaces on which the semiconductor devices are to be mounted.

In addition, the power module package 100 further includes the semiconductor devices 114 and 124, and metal layers 140 for soldering, and since these are the same as set forth in the first preferred embodiment, the detailed description related to these will be omitted.

Although not shown in FIG. 3, in the third preferred embodiment, wires are not formed between the semiconductor devices 114 and 124 and the first and second lead frames 111 and 121, but formed on other lead frames (not shown) disposed correspondingly to the first and second lead frames, except the first and second lead frames.

The reason of such constitution is to prevent a short beforehand, which may occur at the time of electric connection in a case where the same wires as the first preferred embodiment are embodied in a structure where an insulating layer is not formed on the first surfaces of the first and second lead frames 111 and 121.

Here, the wires formed between the semiconductor devices 114 and 124 may be formed in the same manner as the first preferred embodiment. The reason is that a collector and an emitter may be opened or closed by a gate in each of the semiconductor devices 114 and 124.

In addition, the power module package 100 of the third preferred embodiment may further include a molding 130 formed for covering a region between the first and second lead frames 111 and 121, and the semiconductor devices 114 and 124 mounted on the first and second lead frames 111 and 121.

In addition, the molding 130 is formed on the second surfaces of the first and second lead frames 111 and 121.

The reason is to secure an insulation property without loss of heat radiation property, by partially covering the second surfaces corresponding to the bottom surfaces of the first and second lead frames 111 and 121 with the molding, as shown in FIG. 3, in a case where semiconductor devices requiring high insulation property is applied to the power module package 100.

Here, the molding 130 formed above the second surfaces of the first and second lead frames 111 and 121 needs to be formed such that it can improve the insulation property without loss of heat radiation property within the range in which a thickness of the power module package is less influenced.

Figure 4:
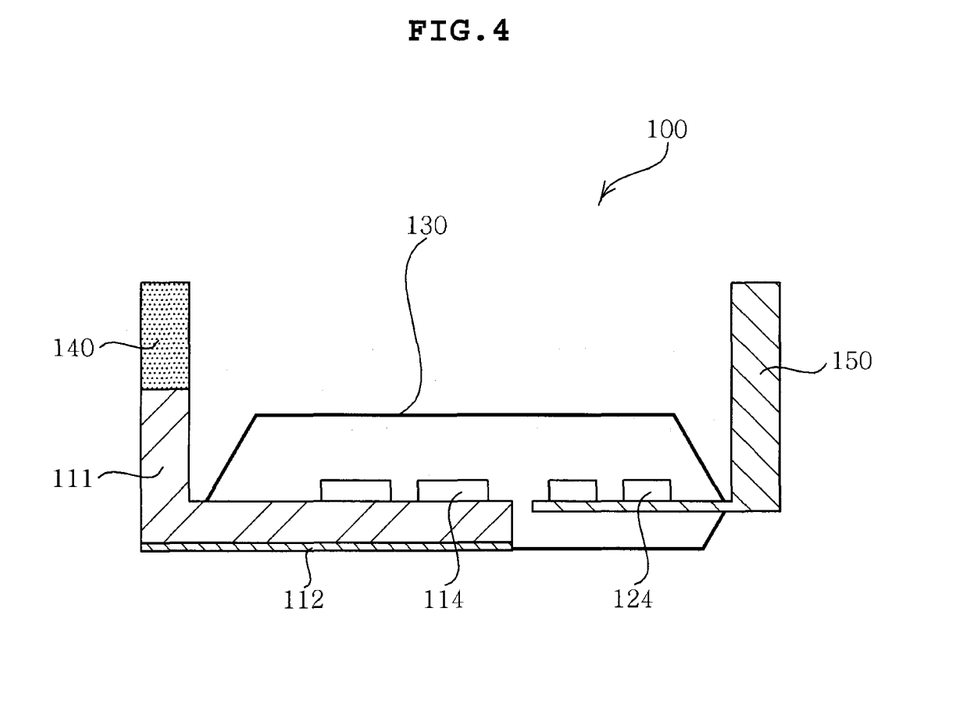
FIG. 4 shows a configuration of a power module package according to a fourth preferred embodiment of the present invention.

FIG. 4 shows a configuration of a power module package according to a fourth preferred embodiment of the present invention.

As shown in FIG. 4, a power module package 100 includes first and second lead frame 111 and 121 which are arranged to face each other, both or either of them being made of aluminum, anodized layers 112 and 122 respectively formed on portions of the lead frame(s) in the first and second lead frames 111 and 121, and semiconductor devices 114 and 124 respectively mounted on first surfaces of the first and second lead frames 111 and 121.

In the preferred embodiment of the present invention, it will be defined that the first surfaces of the first and second lead frames mean surfaces on which semiconductor devices are to be mounted, and second surfaces of the first and second lead frames mean surfaces opposite to the surfaces on which the semiconductor devices are to be mounted.

In the present preferred embodiment, the first lead frame 111 may be made of aluminum, and a power device 114 may be mounted on a first surface of the first lead frame 111.

Meanwhile, the second lead frame 150 may be formed of any material that can be generally used as a lead frame material, besides aluminum.

As such, only the first lead frame 111, on which the power device 114 having a high calorific value is mounted, is formed of aluminum materials, thereby imparting selective heat radiation property to the power module package and reducing the fabrication costs of the power module package.

In addition, the power module package 100 further includes the semiconductor devices 114 and 124, a molding 130, and metal layers 140 for soldering, and since these are the same as set forth in the first preferred embodiment, the detailed description related to these will be omitted.

Although not shown in FIG. 4, in the fourth preferred embodiment, wires are not formed between the semiconductor devices 114 and 124 and the first and second lead frames 111 and 121, but formed on other lead frames (not shown) disposed correspondingly to the first and second lead frames, except the first and second lead frames.

The reason of such constitution is to prevent a short beforehand, which may occur at the time of electric connection in a case where the same wires as the first preferred embodiment are embodied in a structure where an insulating layer is not formed on the first surfaces of the first and second lead frames 111 and 121.

Here, the wires formed between the semiconductor devices 114 and 124 may be formed in the same manner as the first preferred embodiment. The reason is that a collector and an emitter may be opened or closed by a gate in each of the semiconductor devices 114 and 124.

Method for Fabricating Power Module Package

FIGS. 5 to 12 are process flowcharts of a method for fabricating a power module package according to a preferred embodiment of the present invention, which will be described with reference to FIGS. 1 to 4.

In the preferred embodiment of the present invention, it will be defined that the first surfaces of the first and second lead frames mean surfaces on which semiconductor devices are to be mounted, and second surfaces of the first and second lead frames mean surfaces opposite to the surfaces on which the semiconductor devices are to be mounted.

Figures 5, 6:
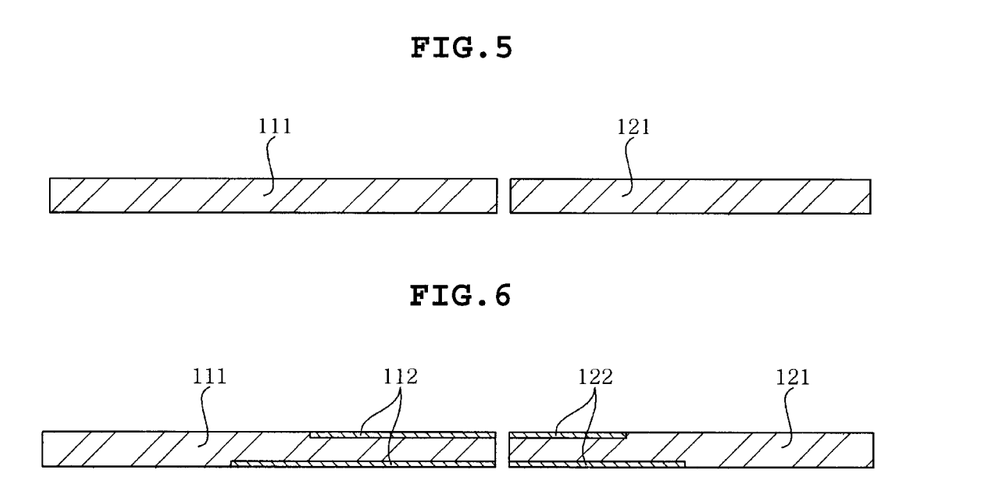
FIGS. 5 to 12 are process flowcharts of a method for fabricating a power module package according to a preferred embodiment of the present invention.

First, as shown in FIG. 5, first and second lead frames 111 and 121 are prepared to face each other. Both or either of the first and second lead frames 111 and 121 is made of aluminum.

Here, each of the first and second lead frames 111 and 121 may be formed by processing an aluminum plate to have a thickness and a size set by operators. Here, the thickness of the first and second lead frames 111 and 121 may be variously selected from 0.1T to 2.5T depending on the purpose desired by the operators, or, without limitation thereto, the first and second lead frames 111 and 121 may be processed out of the range from o.1T to 2.5T.

Next, as shown in FIG. 6, anodized layers 112 and 122 are formed on portions of the lead frame(s) made of aluminum in the first and second lead frames 111 and 121.

In the present preferred embodiment, $Al_2O_3$ layers may be formed on regions of the lead frames, where circuit layers are to be formed, and on the second surfaces of the lead frames, within a range of 20 μm to 200 μm, by using a selective anodizing method, depending on the needs of operators, or without limitation thereto, $Al_2O_3$ layers may be processed out of the above range.

In addition, the anodized layers 112 and 122 may be formed by performing a selective anodizing process on regions, where the anodized layers are required, by using photoresist (PR), dry film resist (DFR), a metal mask, and a masking resin. Here, the anodizing process may be performed on the first surfaces and the second surfaces at the same time, or either the first surfaces or the second surfaces selectively, in the first and second lead frames 111 and 121.

As shown in FIGS. 1 and 6, the anodized layers 112 and 122 according to the first preferred embodiment may be formed on the regions where the semiconductor devices 114 and 124 are to be mounted, in the first surfaces of the first and second lead frames 111 and 121, and on the second surfaces of the first and second lead frames 111 and 121.

In addition, as shown in FIGS. 2 and 3, the anodized layers in the second and third preferred embodiments may be formed on the second surfaces of the first and second lead frames 111 and 121.

Figure 7:
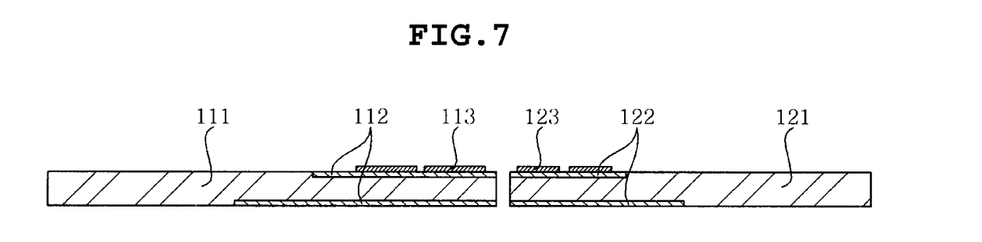

Next, as shown in FIG. 7, the metal layers 113 and 123 for circuit are formed on the regions where the semiconductor devices 114 and 124 are to be mounted, in the anodized layers.

Here, the metal layers 113 and 123 for circuit are formed by forming a metal layer through dry sputtering, or wet electroless and electrolytic plating, and then forming pads and circuit layers through wet chemical etching and electrolytic etching, or a lift-off process.

In the present preferred embodiment, all the pads and circuit layers will refer to metal layers 113 and 123 for circuit.

For example, the metal layers 113 and 123 for circuit may be made of any one of Cu, Cu/Ni, Cu/Ti, Au/Pt/Ni/Cu and Au/Pt/Ni/Cu/Ti, but may be made of other materials applicable to pads or circuit layers, without limitation thereto. Here, the symbol "I" will be defined to mean "and".

Here, the description of the step of forming the metal layers 113 and 123 for circuit will be omitted due to being the same description in the second to fourth preferred embodiments (FIGS. 2 to 4).

Figure 8:
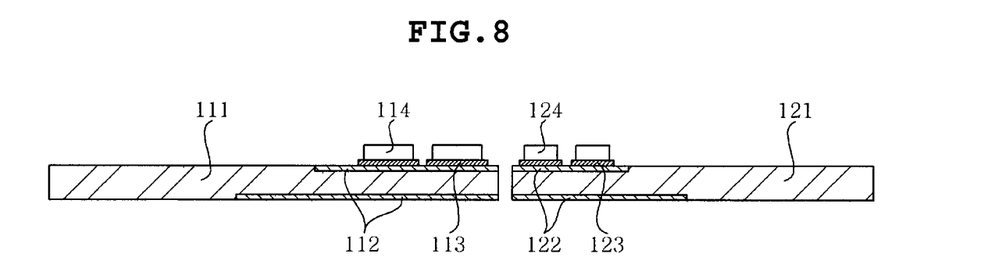

Next, as shown in FIG. 8, the semiconductor devices 114 and 124 are mounted on the first surfaces of the first and second lead frames 111 and 121.

Here, a binding material of the semiconductor devices 114 and 124 may be solder or organic resin, but, without limitation thereto, any binding material that can efficiently transfer the heat from the semiconductor devices may be applicable.

Meanwhile, in the first to third preferred embodiments, when the semiconductor devices are mounted, a power device 114 and a control device 124 are mounted on the first surfaces of the first lead frame 111 and the second lead frame 121, respectively.

As such, in the present embodiment of the present invention, the power device 114 having a high calorific value, such as, an insulated gate bipolar transistor (IGBT), a diode, or the like, and the control device 124 having a small calorific value, such as, a control integrated circuit (IC), are separately mounted on the first lead frame 111 and the second lead frame 121, respectively. Therefore, it is expected that the heat generated from the power device does not influence the control device.

In addition, in the fourth preferred embodiment as shown in FIG. 4, the first lead frame 111 may be made of aluminum, and the power device 114 may be mounted on the first surface of the first lead frame 111.

Meanwhile, the second lead frame 121 may be formed of any material that can be generally used as a lead frame material, besides aluminum.

As such, only the first lead frame 111, on which the power device 114 having a high calorific value is mounted, is formed of aluminum materials, thereby imparting selective heat radiation property to the power module package and reducing fabrication costs of the power module package.

Figure 9:
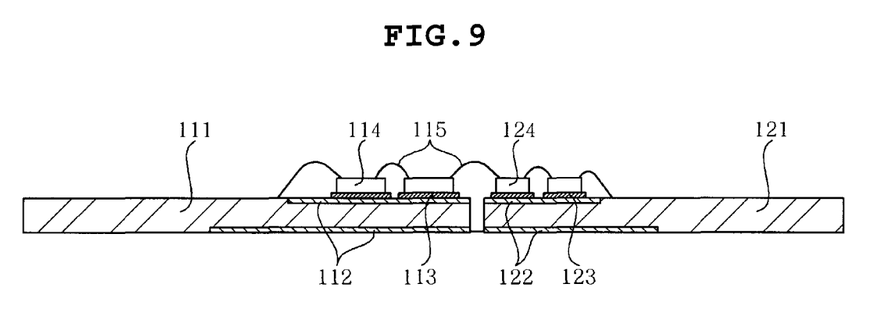

Next, as shown in FIG. 9, wires 115 may be formed for electric connection between the semiconductor devices 114 and 124 and the first and second lead frames 111 and 121, or between the semiconductor devices 114 and 124.

Figure 10:
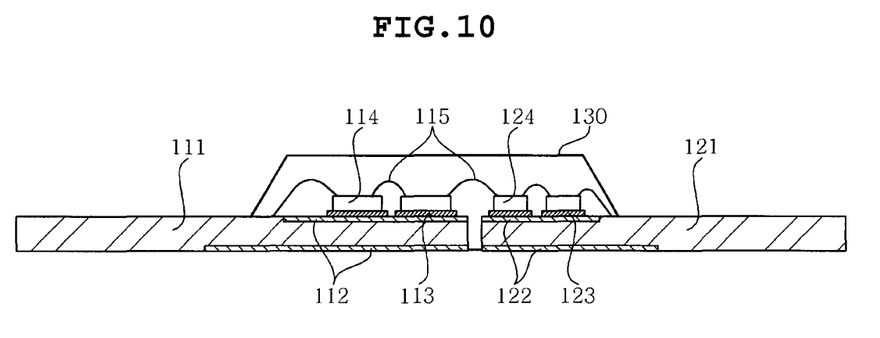

Next, as shown in FIG. 10, a molding is formed to cover a region between the first and second lead frames 111 and 121, and the semiconductor devices 114 and 124 mounted on the first and second lead frames 111 and 121.

In other words, the molding is formed in such a manner that it surrounds the entire region except regions for connecting with the outside, in the first and second lead frames 111 and 121, and the second surfaces of the first and second lead frames 111 and 121.

If high insulation property is required, as shown in FIG. 3, the molding may be formed on the second surfaces of the first and second lead frames 111 and 121.

Figure 11:
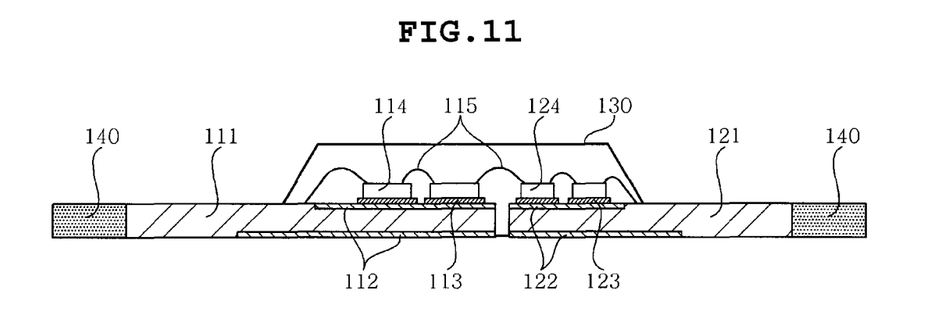

Next, as shown in FIG. 11, metal layers 140 for soldering are formed in soldering regions of the lead frame(s) made of aluminum in the first and second lead frames 111 and 121.

Here, the metal layers 140 for soldering are configured to supplement a hardly solderable aluminum material, which may be realized by using a solderable metal material including tin (Sn).

As shown in FIG. 11, the metal layers 140 for soldering may be formed on both ends of the first and second lead frames 111 and 121, which are regions required to be soldered.

Figure 12:
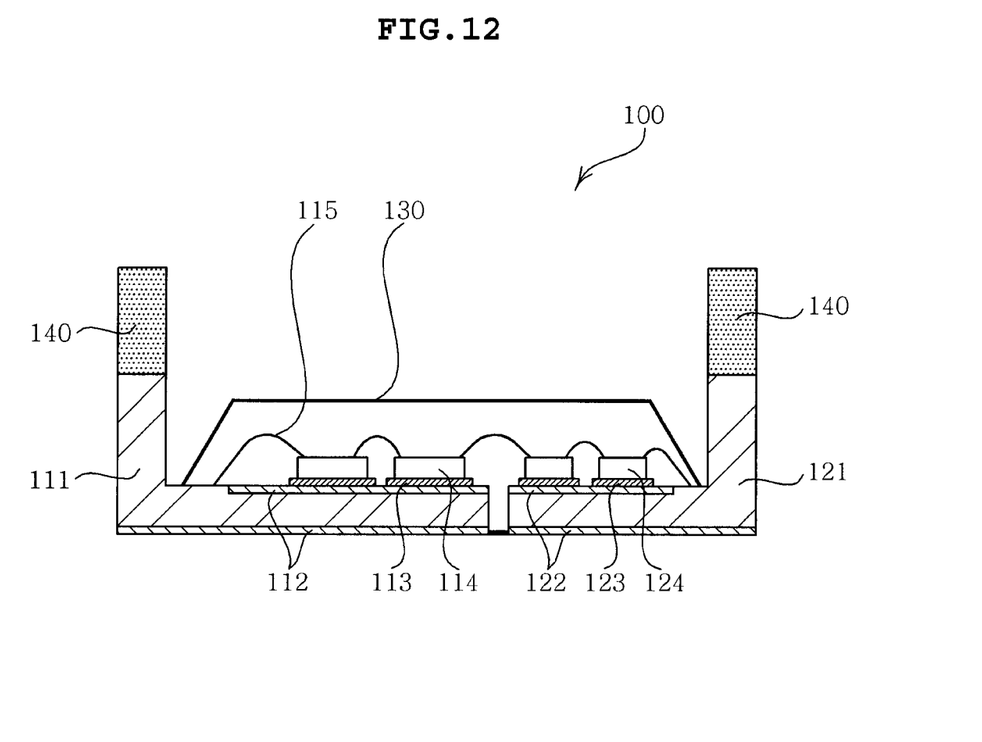

Next, as shown in FIG. 12, forms of the first and second lead frames 111 and 121 are formed so that the first and second lead frames 111 and 121 are coupled with a printed circuit board (not shown).

For example, as shown in FIG. 12, the forms of the first and second lead frames 111 and 121 are formed in such a manner that both sides of the first and second lead frames 111 and 121 are bent in a vertical direction.

According to the present invention, the lead frames and the anode-oxidized metal substrates having excellent heat radiation property are formed as a single body, thereby shortening heat radiation path, and thus, the heat generated from the semiconductor devices can be efficiently radiated.

Furthermore, according to the present invention, the power device having a high calorific value and a control device having a smaller calorific value than the power device and vulnerable to heat are separately arranged, thereby previously preventing the heat generated from the power device from influencing the control device and as a result, improving the reliability and the life time driving characteristic of products.

Furthermore, according to the present invention, since the lead frames and the heat radiation substrate are integrated as a single body, the fabrication costs of the power module package can be reduced.

Moreover, according to the present invention, the down-set structure is not applied to the lead frame, thereby facilitating a packaging process and reducing the process costs.

Although the preferred embodiments of the present invention have been disclosed for illustrative purposes, they are for specifically explaining the present invention and thus a power module package providing a method of manufacturing the same according to the present invention are not limited thereto, but those skilled in the art will appreciate that various modifications, additions and substitutions are possible, without departing from the scope and spirit of the invention as disclosed in the accompanying claims. Accordingly, such modifications, variations or equivalent arrangements should be considered to be within the scope of the invention, and the detailed scope of the invention will be disclosed by the accompanying claims.

What is claimed is:

1. A power module package, comprising:
a first lead frame made of aluminum;
a second lead frame arranged with a predetermined distance apart from the first lead frame and made of aluminum;
one or more semiconductor devices mounted on first surfaces of the first and second lead frames;
anodized layers formed on a region where the semiconductor devices are to be mounted, in the first surfaces of the first and second lead frames, and on second surfaces of the first and second lead frames; and
one or more metal layers for circuit formed between the anodized layers and the semiconductor devices.

2. The power module package as set forth in claim 1, wherein the semiconductor devices include a power device and a control device mounted on the first surfaces of the first lead frame and the second lead frame, respectively.

3. The power module package as set forth in claim 1, wherein the first lead frame is made of aluminum and the power device is mounted on the first surface of the first lead frame.

4. The power module package as set forth in claim 1, further comprising metal layers for circuit on the regions where the semiconductor devices are to be mounted, in the first surfaces of the first and second lead frames.

5. The power module package as set forth in claim 1, further comprising wires for electric connection between the semiconductor devices and the first and second lead frames, or between the semiconductor devices.

6. The power module package as set forth in claim 1, further comprising a molding covering a region between the first and second lead frames, and the semiconductor devices mounted on the first and second lead frames.

7. The power module package as set forth in claim 6, wherein the molding is formed to expose the second surfaces of the first and second lead frames.

8. The power module package as set forth in claim 6, wherein the molding is formed on the second surfaces of the first and second lead frames.

9. The power module package as set forth in claim 1, further comprising metal layers for soldering formed on soldering regions of the lead frame(s) made of aluminum in the first and second lead frames.

* * * * *